US006504376B2

(12) United States Patent
Werner, Jr.

(10) Patent No.: US 6,504,376 B2
(45) Date of Patent: Jan. 7, 2003

(54) AUTOMATIC MODULATION CONTROL FOR ESV MODULATORS

(75) Inventor: Alan J. Werner, Jr., Rochester, NY (US)

(73) Assignee: Xerox Corporation, Rochester, NY (US)

( * ) Notice: Subject to any disclaimer, the term of this patent is extended or adjusted under 35 U.S.C. 154(b) by 140 days.

(21) Appl. No.: 09/725,398

(22) Filed: Nov. 29, 2000

(65) Prior Publication Data

US 2002/0063563 A1 May 30, 2002

(51) Int. Cl.[7] .......... G01R 29/12
(52) U.S. Cl. .......... 324/458; 324/457
(58) Field of Search .......... 324/458, 457, 324/72.5, 105, 72

(56) References Cited

U.S. PATENT DOCUMENTS 3,851,247 A * 11/1974 Vosteen et al. .......... 324/109
5,243,292 A * 9/1993 Borton et al. .......... 324/458
5,489,850 A * 2/1996 Werner, Jr. et al. .......... 324/458
5,754,918 A * 5/1998 Mestha et al. .......... 399/48
5,950,040 A 9/1999 Mestha et al. .......... 399/46

* cited by examiner

*Primary Examiner*—N. Le
*Assistant Examiner*—T. R. Sundaram
(74) *Attorney, Agent, or Firm*—Perman & Green, LLP

(57) ABSTRACT

Method and apparatus for modulating the vibrations of an object with a constant amplitude has a sensor, e.g., a piezoelectric transducer, for sensing the vibrations. A light source, e.g., an LED, receives the sensed signal and illuminates a light dependent resistor (LED) In turn, a control circuit controls the vibration amplitude in accordance with the LDR resistance. A full wave bridge rectifier can be used between the sensor and the LED.

16 Claims, 4 Drawing Sheets

FIG. 2A
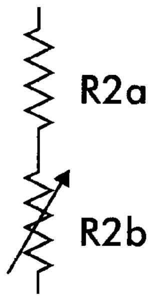
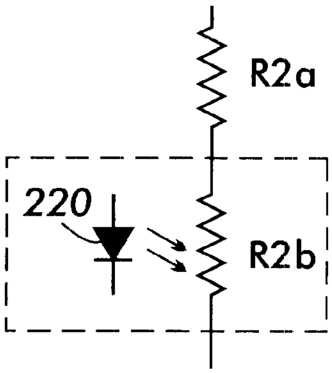
FIG. 2B

AUTOMATIC MODULATION CONTROL FOR ESV MODULATORS

CROSS-REFERENCES TO RELATED APPLICATIONS

This application is related to U.S. Pat. No. 6,381,426.

STATEMENT REGARDING FEDERALLY SPONSORED RESEARCH OR DEVELOPMENT

Not Applicable

BACKGROUND OF THE INVENTION

1. Field of the Invention

The present invention relates to vibration amplitude control, and more particularly, to such control when used with ESVs (electrostatic voltmeters) in xerographic copying machines.

2. Description of the Related Art Including Information Disclosed Under 37 CFR 1.97 and 1.98

In xerographic copying machines it is desired to measure the potential on a photoreceptor to achieve better copy quality. This is done using an ESV. However, the standard "feedback" ESV is a second order feedback system. The "speed of response" of the ESV is dependent on the open loop gain of the system, which in dependent on both the spacing between a sense head and the mechanical vibration modulation (change in this spacing). If the system gain is "high", the output will overshoot the final value. If it is "low", it will be slow or underdamped. If it is "optimized", it is "critically" damped, i.e., it is going as fast as possible without overshooting. In practice, there is an electronic gain control that is adjusted in the factory setup procedure to give the desired output response at the calibration spacing and the assumption is made that the amount of modulation stays constant.

In fact, vibration modulation is dependent on a stable modulating structure, such as the standard tuning fork and the newer ASIC (application specific integrated circuit) ESV "vibrating beam". Also needed is a stable mounting system for that structure with enough rigidity and mass that the energy supplied by the driver, which causes the modulator to move, goes entirely into moving the modulator and is not absorbed by the mounting structure or by vibrating a complete probe or modulator assembly.

It is noted that a large modulating amplitude is desired for a high modulating frequency and high signal-to-noise ratio. While a good mount resolves this problem, it is difficult and expensive to achieve in a mass-produced product.

While it is known to use a feedback circuit to maintain a constant amplitude, such circuits typically have a fast time constant in order to measure a peak voltage. In the present application, this results in the feedback voltage being a function of frequency which is undesirable. Increasing the value of capacitors and/or resistors has the effect of increasing only the discharging time. This is undesirable since for ESVs it is desired to have both charging and discharging times equal.

It is therefore desirable to have a frequency independent constant amplitude mechanical vibration modulation in order to reduce the requirements on a mount and achieve optimum gain, and thus a constant optimum response speed.

BRIEF SUMMARY OF THE INVENTION

A method of modulating the vibrations of an object with a substantially constant mechanical amplitude comprises providing an electrical signal in accordance with the amplitude of said mechanical vibrations; applying the provided signal to a light source; applying the light emitted by said source to a light dependent resistor having a slow response time compared to the modulating frequency; and using the resistance of said resistor to control the amplitude of said mechanical vibrations to a substantially constant value.

Apparatus for modulating the vibrations of an object with a substantially constant mechanical amplitude comprises a transducer providing an electrical signal in accordance with the amplitude of said vibrations; a light source receiving the provided signal; a light dependent resistor having a slow response time compared to the modulating frequency receiving the light emitted by said source; and a control circuit coupled to said resistor controlling the amplitude of said vibrations to a substantially constant value.

It is noted that the basic system of LED/LDR control has been adopted by the audio industry many years ago as means of preventing signal overload; by proper circuit choices, limiting can be made "rounded" or "soft" which is tolerated by the ear much better than the "harsh" limiting of a solid state system.

BRIEF DESCRIPTION OF THE SEVERAL VIEWS OF THE DRAWING(S)

FIGS. 2A and 2B show modifications of FIG. 2; and

In the figures corresponding elements have been given corresponding reference numbers.

DETAILED DESCRIPTION OF THE INVENTION

It will become evident from the following discussion that the present invention is equally well-suited for use in a wide variety of printing systems including ionographic printing machines and discharge area development systems, as well an other more general non-printing systems providing multiple or variable outputs such that the invention is not necessarily limited in its application to the particular system shown herein.

Figure 1:
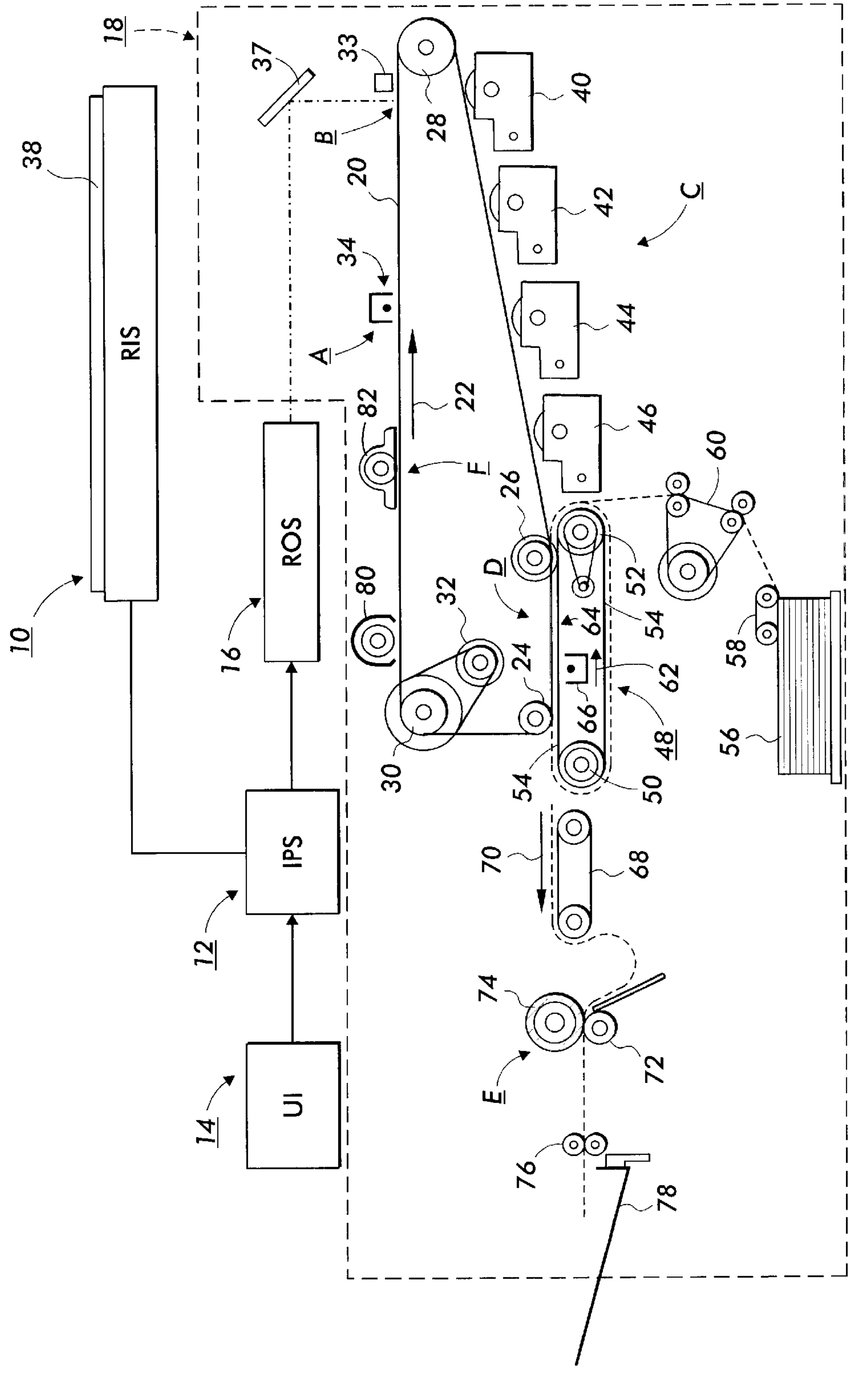
FIG. 1 shows a general view of a copying apparatus.

Turning initially to FIG. 1, before describing the particular features of the present invention in detail, an exemplary electrophotographic copying apparatus will be described. The exemplary electrophotographic system may be a multicolor copier, as for example, the recently introduced Xerox Corporation "5775" copier. To initiate the copying process, a multicolor original document 38 is positioned on a raster input scanner (RIS), indicated generally by the reference numeral 10. The RIS 10 contains document illumination lamps, optics, a mechanical scanning drive, and a charge coupled device' (CCD array) for capturing the entire image from original document 38. The RIS 10 converts the image to a series of raster scan lines and measures a set of primary color densities, i.e. red, green and blue densities, at each point of the original document. This information is transmitted as an electrical signal to an image processing system (IPS), indicated generally by the reference numeral 12, which converts the set of red, green and blue density signals to a set of colorimetric coordinates.

The IPS contains control electronics for preparing and managing the image data flow to a raster output scanner (ROS), indicated generally by the reference numeral 16. A user interface (UI), indicated generally by the reference numeral 14, is provided for communicating with IPS 12. UI 14 enables an operator to control the various operator adjustable functions whereby the operator actuates the appropriate input keys of UI 14 to adjust the parameters of the copy. UI 14 may be a touch screen, or any other suitable device for providing an operator interface with the system. The output signal from UI 14 is transmitted to IPS 12 which then transmits signals corresponding to the desired image to ROS 16.

ROS 16 includes a laser with rotating polygon mirror blocks. The ROS 16 illuminates, via mirror 37, a charged portion of a photoconductive belt 20 of a printer or marking engine, indicated generally by the reference numeral 18. Preferably, a multi-facet polygon mirror is used to illuminate the photoreceptor belt 20 at a rate of about 400 pixels per inch. The ROS 16 exposes the photoconductive belt 20 to record a set of three subtractive primary latent images thereon corresponding to the signals transmitted from IPS 12.

One latent image is to be developed with cyan developer material, another latent image is to be developed with magenta developer material, and the third latent image is to be developed with yellow developer material. These developed images are subsequently transferred to a copy sheet in superimposed registration with one another to form a multicolored image on the copy sheet which is then fused thereto to form a color copy. This process will be discussed in greater detail hereinbelow.

With continued reference to FIG. 1, marking engine 18 is an electrophotographic printing machine comprising photoconductive belt 20 which is entrained about transfer rollers 24 and 26, tensioning roller 28, and drive roller 30. Drive roller 30 is rotated by a motor or other suitable mechanism coupled to the drive roller 30 by suitable means such as a belt drive 32. As roller 30 rotates, it advances photoconductive belt 20 in the direction of arrow 22 to sequentially advance successive portions of the photoconductive belt 20 through the various processing stations disposed about the path of movement thereof.

Initially, a portion of photoconductive belt 20 passes through a charging station, indicated generally by the reference letter A. At charging station A, a corona generating device 34 or other charging device generates a charge voltage to charge photoconductive belt 20 to a relatively high, substantially uniform voltage potential. The corona generator 34 comprises a corona generating electrode, a shield partially enclosing the electrode, and a grid disposed between the belt 20 and the unenclosed portion of the electrode. The electrode charges the photoconductive surface of the belt 20 via corona discharge. The voltage potential applied to the photoconductive surface of the belt 20 is varied by controlling the voltage potential of the wire grid.

Next, the charged photoconductive surface is rotated to an exposure station, indicated generally by the reference letter B. Exposure station B receives a modulated light beam corresponding to information derived by RIS 10 having a multicolored original document 38 positioned threat. The modulated light beam impinges on the surface of photoconductive belt 20, selectively illuminating the charged surface of photoconductive belt 20 to form an electrostatic latent image thereon. The photoconductive belt 20 is exposed three times to record three latent images representing each color.

After the electrostatic latent images have been recorded on photoconductive belt 20, the belt is advanced toward a development station, indicated generally by the reference letter C. However, before reaching the development station C, the photoconductive belt 20 passes subjacent to a voltage monitor, preferably an electrostatic voltmeter 33, for measurement of the voltage potential at the surface of the photoconductive belt 20.

The electrostatic voltmeter 33 (as described in detail below) of the present invention provides the measuring condition in which an electrostatic field between a probe electrode and the belt 20 is sensed as known in the art. The voltage potential measurement of the photoconductive belt 20 is utilized to determine specific parameters for maintaining a predetermined potential on the photoreceptor surface.

The development station C includes four individual developer units indicated by reference numerals 40, 42, 44, and 46. The developer units are of a type generally referred to in the art as "magnetic brush development units". Typically, a magnetic brush development system employs a magnetizable developer material including magnetic carrier granules having toner particles adhering triboelectrically thereto. The developer material is continually brought through a directional flux field to form a brush of developer material. The developer material is constantly moving so as to continually provide the brush with fresh developer material. Development is achieved by bringing the brush of developer material into contact with the photoconductive surface. Developer units 40, 42, and 44, respectively, apply toner particles of a specific color corresponding to the compliment of the specific color separated electrostatic latent image recorded on the photoconductive surface.

Each of the toner particle colors is adapted to absorb light within a preselected spectral region of the electromagnetic wave spectrum. For example, an electrostatic latent image formed by discharging the portions of charge on the photoconductive belt corresponding to the green regions of the original document will record the red and blue portions as areas of relatively high charge density on photoconductive belt 20, while the green areas will be reduced to a voltage level ineffective for development. The charged areas are then made visible by having developer unit 40 apply green absorbing (magenta) toner particles onto the electrostatic latent image recorded on photoconductive belt 20. Similarly, a blue separation is developed by developer unit 42 with blue absorbing (yellow) toner particles, while the red separation is developed by developer unit 44 with red absorbing (cyan) toner particles.

Figure 3:
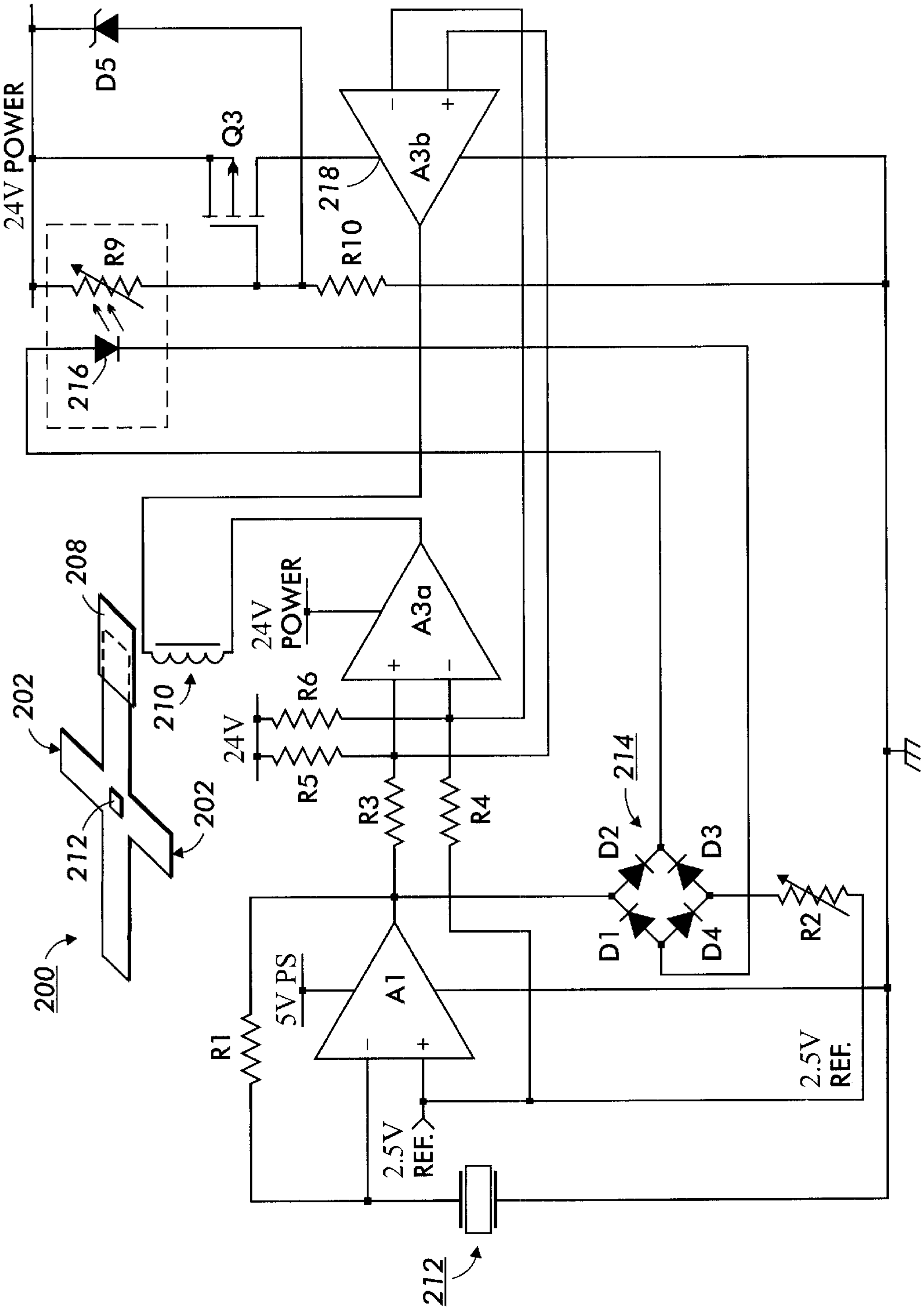
FIG. 3 is a schematic drawing of a second embodiment of the invention.

Developer unit 46 contains black toner particles and may be used to develop the electrostatic latent image formed from a black and white original document. In FIG. 3, developer unit 40 is shown in the operative position with developer units 42, 44, and 46 being in the non-operative position.

After development, the toner image is moved to a transfer station, indicated generally by the reference letter D. Transfer station D includes a transfer zone, generally indicated by reference numeral 64, defining the position at which the toner image is transferred to a sheet of support material, which may be a sheet of plain paper or any other suitable support substrate. A sheet transport apparatus, indicated generally by the reference numeral 48, moves the sheet into contact with photoconductive belt 20. Sheet transport 48 has a belt 54 entrained about a pair of substantially cylindrical rollers 50 and 52. A friction retard feeder 58 advances the uppermost sheet from stack 56 onto a pre-transfer transport 60 for advancing a sheet to sheet transport 48 in synchronism with the movement thereof so that the leading edge of the sheet arrives at a preselected position, i.e. a loading zone. The sheet is received by the sheet transport 48 for movement therewith in a recirculating path. As belt 54 of transport 49 moves in the direction of arrow 62, the sheet is moved into contact with the photoconductive belt 20, in synchronism with the toner image developed thereon.

In transfer zone 64, a corona generating device 66 sprays ions onto the backside of the sheet so as to charge the sheet to the proper magnitude and polarity for attracting the toner image from photoconductive belt 20 thereto. The sheet remains secured to the sheet gripper so as to move in a recirculating path for three cycles. In this manner, three different color toner images are transferred to the sheet in superimposed registration with one another.

Each of the electrostatic latent images recorded on the photoconductive surface is developed with the appropriately colored toner and transferred, in superimposed registration with one another, to the sheet for forming the multi-color copy of the colored original document.

After the last transfer operation, the sheet transport system directs the sheet to a vacuum conveyor, indicated generally by the reference numeral 68. Vacuum conveyor 68 transports the sheet, in the direction of arrow 70, to a fusing station, indicated generally by the reference letter E, where the transferred toner image is permanently fused to the sheet. The fusing station includes a heated fuser roll 74 and a pressure roll 72. The sheet passes through the nip defined by fuser roll 74 and pressure roll 72. The toner image contacts fuser roll 74 so as to be affixed to the sheet. Thereafter, the sheet is advanced by a pair of rolls 76 to a catch tray 78 for subsequent removal therefrom by the machine operator. The last processing station in the direction of movement of belt 20, as indicated by arrow 22, is a cleaning station, indicated generally by the reference letter F.

A lamp 80 illuminates the surface of photoconductive belt 20 to remove any residual charge remaining thereon. Thereafter, a rotatably mounted fibrous brush 82 is positioned in the cleaning station and maintained in contact with photoconductive belt 20 to remove residual toner particles remaining from the transfer operation prior to the start of the next successive imaging cycle.

The foregoing description should be sufficient for purposes of the present application for patent to illustrate the general operation of an electrophotographic printing machine incorporating the features of the present invention. As described, an electrophotographic printing system may take the form of any of several well-known devices or systems. Variations of specific electrophotographic processing subsystems or processes may be expected without affecting the operation of the present invention.

Figure 2:
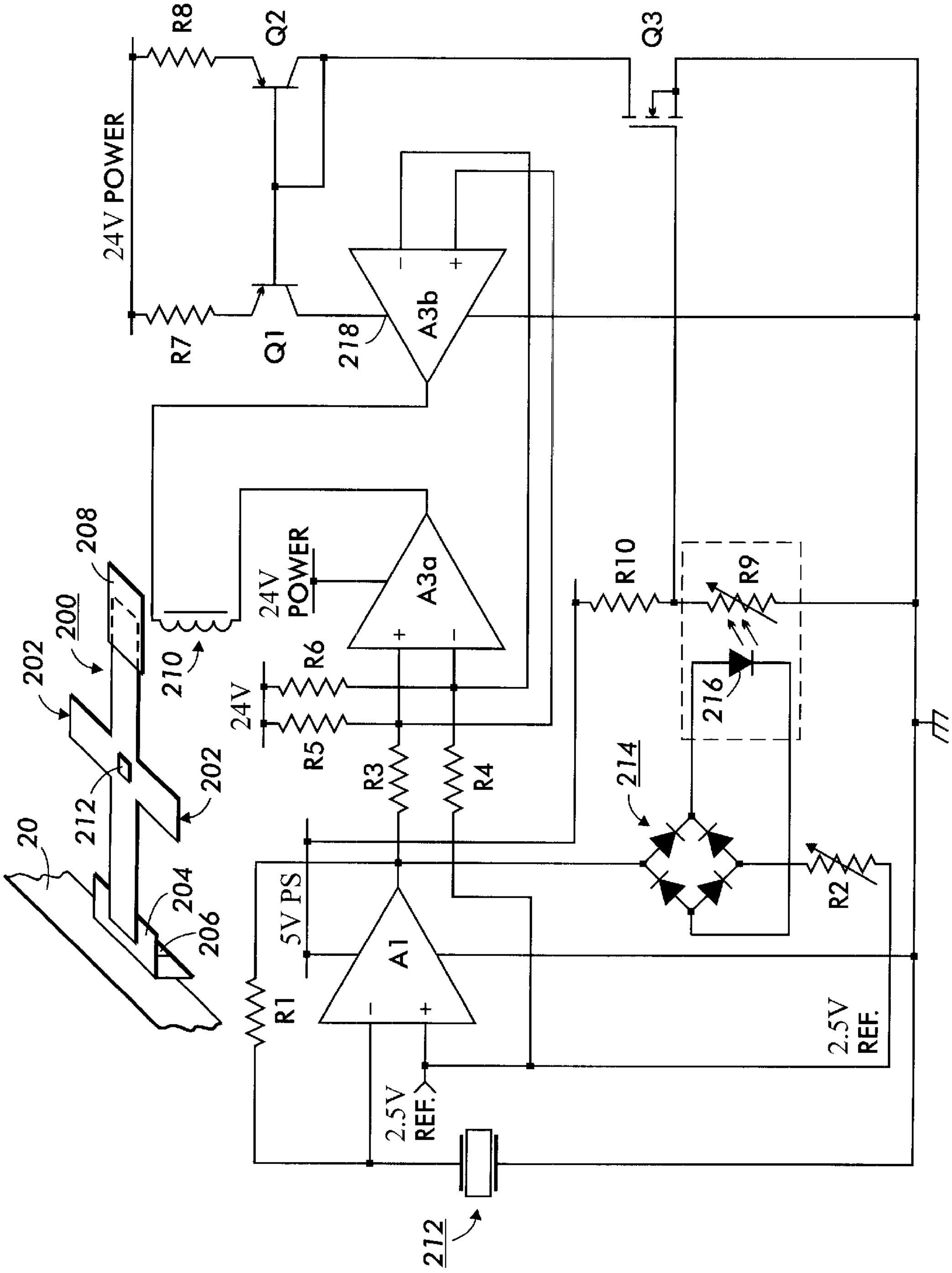
FIG. 2 is a schematic drawing of a first embodiment of the invention.

FIG. 2 shows a first embodiment of the ESV 33. A vibrating beam 200, preferably made of Ph bronze, is disposed near belt 20 and has rigidly mounted beam web ends 202. On a first end is mounted an L-shaped bracket 204, which is disposed between belt 20 and an electrode 206. At a second end of beam 200 is a counterweight 208. If beam 200 is made of a non-magnetic material, then weight 208 must be of a magnetically susceptible material, e.g., Fe, to close a magnetic drive path. Disposed adjacent weight 208 is a permanent magnet core drive coil 210. The permanent magnet biases the position of beam 200. As shown in the art, AC current through coil 210 causes beam 200 and thus bracket 204 to vibrate. In turn, this causes a change in the capacitance between belt 20 and electrode 206. From this, the voltage of belt 20 can be determined.

In order to keep the vibration amplitude constant, a feedback circuit is used. It comprises a piezoelectric crystal sensor 212 is mounted on beam 200, preferably at the left to right center as viewed in FIG. 2 thereof for maximum sensitivity. For clarity sensor 212 is also shown in the schematic portion of the drawing.

The output voltage from sensor 212 is provided to a current-to-voltage converter of operational amplifier A1 and feedback resistor R1. The output voltage from A1 is applied to a level shifting circuit of R3, R4, R5, R6, and then to push-pull amplifier of A3*a* and A3*b*. In turn, amplifier A3 drives coil 210.

The output voltage of A1 is also applied to rectifier 214. As shown, rectifier 214 is preferably a full wave bridge type for greatest sensitivity, accuracy, faster start time, and LED (described below) lifetime, but a half wave type can also be used. Variable resistor R2 adjusts a bias current through rectifier 214 and hence through a light source, e.g., light emitting diode (LED) 216.

A light dependent resistor (LDR) R9 is optically coupled to LED 216 and electrically coupled to resistor R10. Resistors R9 and R10 form a voltage divider than biases the gate of field effect transistor (FET) Q3. If desired, Q3 can be a bipolar transistor. The gate bias voltage sets the source-drain current of Q3. This current is applied to a current mirror including R7, R8, Q1, and Q2, which mirror is in turn coupled to the power input pin 218 of A3*b*. As known in the art, this limits the power from A36 to coil 210 to that of said Q3 source-drain current.

In operation, if the vibration amplitude decreases from a value determined by R2, then this is sensed by amplifier A1 to cause a greater current to be applied to pin 218. This causes greater current in coil 210 so that the vibrational amplitude increases. Similarly, if the amplitude increases from the value determined by R2, a lesser current is applied to pin 218. This causes lesser current in coil 210 so that the vibration amplitude decreases.

It will be appreciated that the use of an LDR in the feedback circuit results in an accurate, reliable, frequency independent vibration amplitude control with a high signal-to-noise ratio. This is true since it has a slow response time compared to the frequency, e.g., 1 KHz, of the modulating signal, which results in measuring the average power rather than the peak value of the feedback voltage. It also results in a large control range since it has a dynamic range of about three decades. Further since LED 216 and LDR R9 are electrically isolated from each other, the circuit design is simplified by eliminating ground loops.

FIG. 2A shows a modification of FIG. 2 wherein resistor R2 comprises a series circuit of a fixed resistor R2*a* and digitally variable potentiometer resistor R2*b*, the remainder of the circuit being the same as in FIG. 2. FIG. 2B shows a second modification of FIG. 2 wherein resistor R2 comprises a series circuit of a fixed resistor R2*a* and an LDR R2*b*, which is optically coupled to an LED 220. The modifications of FIGS. 2A and 2B easily lend themselves to remote adjustment of R2.

FIG. 3 shows a second embodiment of the invention. For simplicity, belt 20, L-shaped bracket 204, and electrode 206 are not shown in FIG. 3, but are actually present as shown in FIG. 2. This second embodiment takes advantage of the electrical isolation from the optical coupling to eliminate Q1, Q2, R7 and R8 and replace them with just a zener diode D5. Diode D5 provides protection to prevent destruction of Q3. As with the first embodiment of FIG. 2, resistor R2 can be a series circuit of a fixed resistor and either a digital potentiometer or LED and LDR.

While the present invention has been particularly described with respect to preferred embodiments, it will be understood that the invention is not limited to these particular preferred embodiments, the process steps, the sequence, or the final structures depicted in the drawings. On the contrary, it is intended to cover all alternatives, modifications, and equivalents as may be included within the spirit and scope of the invention defined by the appended claims. In particular, the scope of the invention is intended to include, for example, those devices and methods. In addition, other methods and/or devices may be employed in the method and apparatus of the instant invention as claimed with similar results.

What is claimed is:

1. A method of modulating the vibrations of an object with a substantially constant mechanical amplitude, said method comprising:

providing an electrical signal in accordance with the amplitude of said mechanical vibrations;

applying the provided signal to a light source;

applying the light emitted by said source to a light dependent resistor having a slow response time compared to the modulating frequency; and using the resistance of said resistor to remotely control the amplitude of said mechanical vibrations to a substantially constant value.

2. The method of claim 1, wherein said object comprises a vibrating beam disposed adjacent a photoreceptor of a xerographic device.

3. The method of claim 1, wherein said providing step comprises piezoelectrically transducing said vibrations.

4. The method of claim 1, wherein said light source comprises an LED.

5. The method of claim 1, wherein said applying step comprises full wave rectifying said electrical signal.

6. The apparatus of claim 1, wherein said variable resistor comprises a digital potentiometer.

7. Apparatus for modulating the vibrations of an object with a substantially constant mechanical amplitude, said apparatus comprising:

a transducer providing an electrical signal in accordance with the amplitude of said vibrations;

a light source receiving the provided signal;

a light dependent resistor having a slow response time compared to the modulating frequency receiving the light emitted by said source;

a control circuit coupled to said resistor controlling the amplitude of said vibrations to a substantially constant value;

a rectifier coupled between said transducer and said light source; and a variable resistor coupled to said rectifier.

8. The apparatus of claim 7, further comprising said object.

9. The apparatus of claim 8, wherein said object comprises a vibrating beam disposed adjacent a photoreceptor of a xerographic device.

10. The apparatus of claim 7, wherein said transducer comprises a piezoelectric one.

11. The apparatus of claim 7, wherein the light source comprises an LED.

12. The apparatus of claim 7, wherein said control circuit comprises an amplifier coupled to said resistor and a coil adapted to be disposed proximate said object and coupled to said amplifier.

13. The apparatus of claim 7, wherein said variable resistor comprises a light dependent resistor.

14. The apparatus of claim 12, wherein said amplifier comprises a push-pull amplifier.

15. The apparatus of claim 12, wherein said control circuit comprises a current mirror coupled to said amplifier.

16. The apparatus of claim 7, wherein said recitifer comprises a full wave rectifier.

* * * * *